(12) United States Patent
Yoshizaki et al.

(10) Patent No.: US 6,194,943 B1
(45) Date of Patent: Feb. 27, 2001

(54) INPUT CIRCUIT PROTECTION

(75) Inventors: Shoichi Yoshizaki, Sunnyvale, CA (US); Katsuji Satomi, Osaka (JP)

(73) Assignee: Matsushita Electric Industrial Co., Ltd.

( * ) Notice: Subject to any disclaimer, the term of this patent is extended or adjusted under 35 U.S.C. 154(b) by 0 days.

(21) Appl. No.: 09/256,894

(22) Filed: Feb. 24, 1999

(30) Foreign Application Priority Data

Feb. 25, 1998 (JP) .................................................. 10-043057

(51) Int. Cl.[7] ................................. H03K 5/08; H03K 5/00
(52) U.S. Cl. ........................ 327/318; 327/313; 327/314; 327/321
(58) Field of Search .................................... 327/309, 312, 327/313, 314, 318, 320, 321, 328; 361/56, 91

(56) References Cited

U.S. PATENT DOCUMENTS 5,333,093 * 7/1994 Krautschneider et al. ............. 361/56
5,748,033 * 5/1998 Kaveh et al. ......................... 327/545

OTHER PUBLICATIONS

Kenneth Mason Publications Ltd (Reserach Disclosure, No. 303, England), Jul. 1989.*

* cited by examiner

Primary Examiner—Terry D. Cunningham
Assistant Examiner—Quan Tra
(74) Attorney, Agent, or Firm—Harness, Dickey & Pierce, P.L.C.

(57) ABSTRACT

The input circuit of the present invention includes an NMOSFET. One terminal of the NMOSFET is connected to an input terminal and the gate of the NMOSFET is connected to a power supply terminal via a clamping circuit. A signal, received at the one terminal of the NMOSFET with an amplitude equal to or larger than that of a power supply voltage, is output through the other terminal of the NMOSFET with an amplitude equal to that of the power supply voltage. The input circuit further includes: a gate controller, which is connected to the other terminal of the NMOSFET; and a PMOSFET. One terminal of the PMOSFET is directly connected to the other terminal of the NMOSFET and the gate of the PMOSFET is also connected to the other terminal of the NMOSFET via the gate controller. If the voltage at the other terminal of the NMOSFET is at a high level, the gate controller turns the PMOSFET ON. Alternatively, if the voltage at the other terminal of the NMOSFET is at a low level, the gate controller turns the PMOSFET OFF. In this manner, the gate controller controls the PMOSFET such that the input signal is transmitted to the other terminal of the NMOSFET. The input circuit can receive a signal with a voltage higher than the power supply voltage and yet does not increase the propagation delay of the input signal even if the power supply voltage is reduced.

5 Claims, 6 Drawing Sheets

INPUT CIRCUIT PROTECTION

BACKGROUND OF THE INVENTION

The present invention relates to an improved input circuit protected against an input signal having a high voltage exceeding a breakdown voltage thereof, and more particularly relates to specific measures taken not to delay the propagation of signals transmitted therethrough even if the power supply voltage thereof is reduced.

In recent years, as the size of semiconductor large-scale integrated circuits (hereinafter, abbreviated as an "LSI's"), which an input circuit is made up of, has been drastically reduced, individual MOS transistors, which are integrated in each single LSI, have also been downsized correspondingly. In an MOS transistor of such an extremely small size, the breakdown voltage of the gate oxide film thereof is much lower than what it used to be, and is almost inoperative with a conventional power supply voltage. Accordingly, as such everlasting downsizing of LSI's proceeds, a power supply voltage for operating an input circuit goes on decreasing from 5 V, which was a commonplace until just recently, into 3.3 V and then into 2.5 V. Under the latest circumstances such as these, it is not unusual that brand-new miniaturized LSI's, operating at a reduced voltage like 3.3 V, and conventional LSI's, operating at 5 V as ever, coexist within a single semiconductor device. Thus, the output of an LSI operating at 5 V might possibly be supplied to an LSI operating at 3.3 V. If the gate oxide film of an LSI operating at 3.3 V is poorly resistant to a voltage as high as 5 V, then the film is very likely to deteriorate and eventually causes dielectric breakdown. In view of this state in the art, input circuits of various types have been designed to eliminate problems caused by the input of a signal with a voltage exceeding a nominal breakdown voltage.

Figure 4:
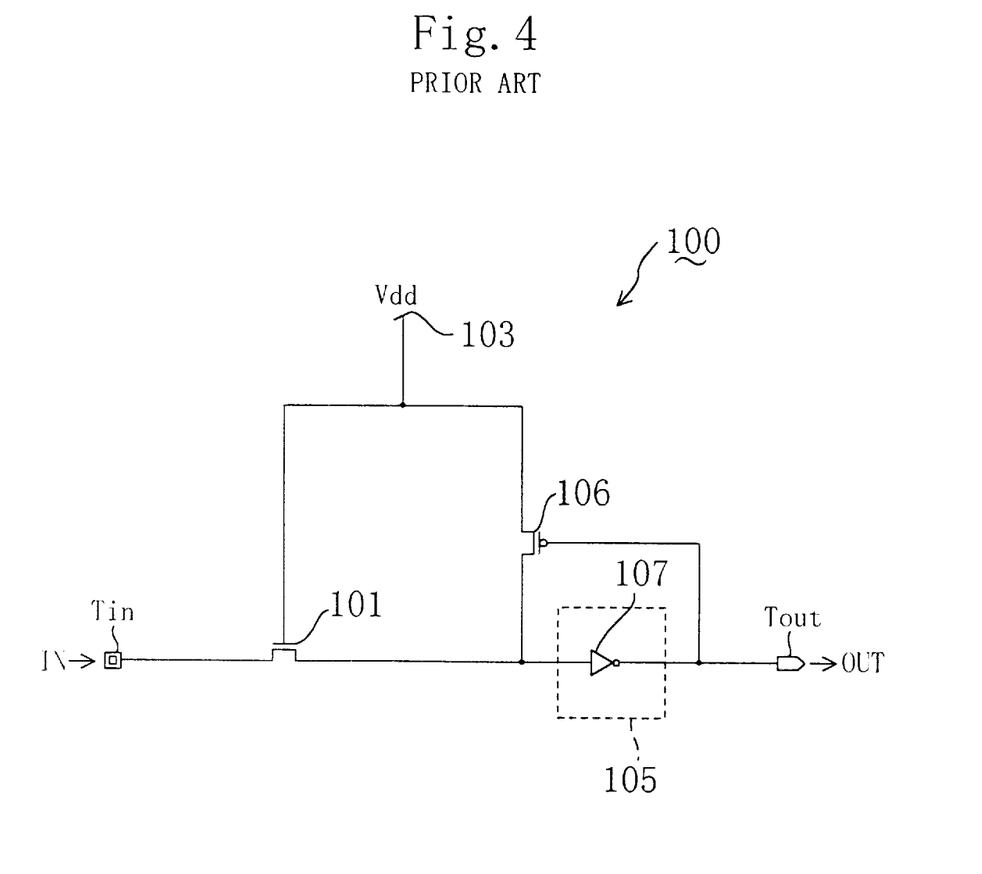
FIG. 4 is an electric circuit diagram illustrating a configuration of a prior art input circuit.

Hereinafter, a prior art input circuit will be described with reference to the drawings. FIG. 4 is an electric circuit diagram illustrating a configuration for a prior art input circuit.

As shown in FIG. 4, an input signal IN is received at an input terminal Tin of an input circuit 100 from the outside of an LSI. And an output signal OUT is transmitted to other internal circuits within the LSI through an output terminal Tout of the input circuit 100. A power supply voltage Vdd is supplied through a power supply terminal 103 into the input circuit 100. The input circuit 100 further includes: an n-channel MOS transistor (NMOSFET) 101; a p-channel MOS transistor (PMOSFET) 106; and a controller 105, implemented as an inverter 107, for controlling the gate voltage at the PMOSFET 106. In the illustrated example, the power supply voltage Vdd supplied through the power supply terminal 103 is supposed to be. 3.3 V and the gate oxide film of each MOS transistor included in the input circuit 100 is supposed to have a breakdown voltage of 3.6 V. In general, the breakdown voltage of a gate oxide film is usually defined to have some margin with respect to a power supply voltage. Accordingly, as is also the case with this circuit 100, the breakdown voltage of the gate oxide film of each MOSFET included in an LSI operating with a power supply voltage of 3.3 V is often defined at about 3.6 V.

Next, the operation of the input circuit 100 having such a configuration will be described with reference to FIG. 4.

If an input signal IN with a voltage of 5 V is received at the input terminal Tin, a voltage at one terminal of the NMOSFET 101, closer to the inverter 107, increases. However, at a point in time the input voltage of the inverter 107 reaches a voltage (Vdd−Vtn) obtained by subtracting the threshold voltage. Vtn of the NMOSFET 101 from the power supply voltage Vdd, the NMOSFET 101 turns OFF. In this case, a back bias effect is caused. Accordingly, supposing the threshold voltage Vtn of the NMOSFET 101 is 1 V, the NMOSFET 101 turns OFF when the input voltage of the inverter 107 reaches 2.3 V. On the other hand, supposing the switching voltage Vsw of the inverter 107 is equal to one half of the power supply voltage Vdd (i.e., (Vdd/2)), the switching voltage Vsw is 1.65 V. In this case, since the input voltage of the inverter 107 is 2.3 V, the inverter 107 inverts an H-level signal to output an L-level signal. In response thereto, the PMOSFET 106 turns ON and the input voltage of the inverter 107 further increases up to 3.3 V. In such a state, a gate voltage Vg1 at the NMOSFET 101 is 3.3 V. Accordingly, the substrate potential and the gate potential, sandwiching the gate oxide film therebetween, are 5 and 3.3 V, respectively, i.e., the potential difference across the gate oxide film of the NMOSFET 101 is 1.7 V. Thus, the potential difference across the gate oxide film does not exceed its breakdown voltage of 3.6 V. In any other transistor in the input circuit 101, the potential difference across the gate oxide film thereof does not exceed the breakdown voltage thereof. As a result, the L-level signal is output through the output terminal Tout.

Alternatively, if an input signal IN with a voltage of 0 V is received at the input terminal Tin, the input voltage of the inverter 107 is also 0 V. Thus, the inverter 107 outputs an H-level signal with a voltage of 3.3 V to turn the PMOSFET 106 OFF. Even in such a state, the potential difference across the gate oxide film does not exceed the breakdown voltage thereof in any transistor in the input circuit 101, either. As a result, the H-level signal is output through the output terminal Tout.

As can be understood, even if a voltage, exceeding the breakdown voltage of the gate oxide film of an MOS transistor included in an LSI, is supplied, above problems do not happen in this conventional input circuit.

Figure 5A:
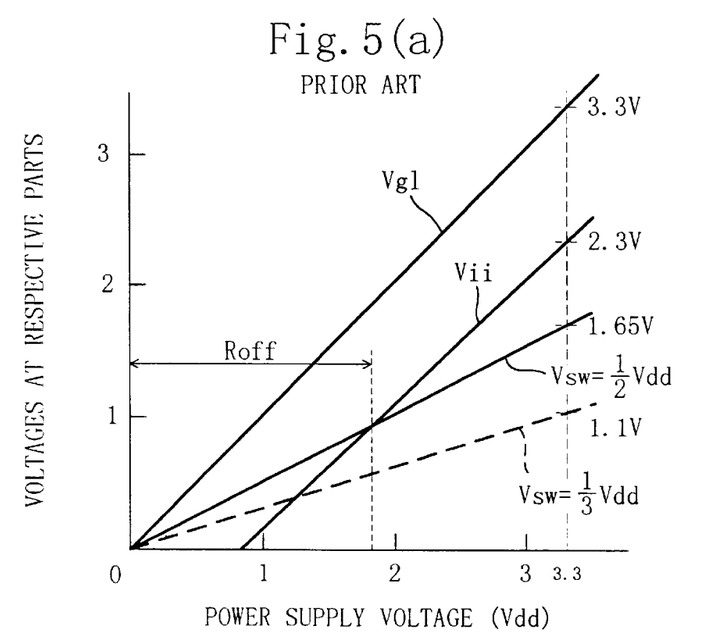

This input circuit, however, is non-operative if the power supply voltage Vdd is reduced. FIG. 5(a) is graph illustrating respective variations in gate voltage Vg1 of the NMOSFET 101 and switching voltage Vsw and input voltage Vii of the inverter 107 with a power supply voltage Vdd in the conventional input circuit 100. In FIG. 5(a), the axis of abscissas indicates the power supply voltage Vdd and the axis of ordinates indicates voltages at respective parts. The switching voltage Vsw of the inverter 107 is in proportion to the power supply voltage Vdd. For example, when the power supply voltage Vdd is 3.3 V, the switching voltage Vsw is 1.65 V. The input voltage Vii of the inverter 107 is obtained by subtracting the threshold voltage Vtn of the NMOSFET 101 from the power supply voltage Vdd. For instance, when the power supply voltage Vdd is 3.3 V, the input voltage Vii is 2.3 V. At the power supply voltage of 3.3 V, since the input voltage Vii (2.3 V) of the inverter 107 is higher than its switching voltage Vsw (1.65 V), the inverter 107 inverts the signal level from high into low to turn the PMOSFET 106 ON. However, if the power supply voltage Vdd is around 2 V, then the input voltage Vii of the inverter 107 may be lower than the switching voltage Vsw, considering the variation in power supply voltage Vdd. In FIG. 5(a), the range where Vii is lower than Vsw is identified by Roff. Accordingly, the inverter 107 sometimes might be non-operative.

Figure 5B:
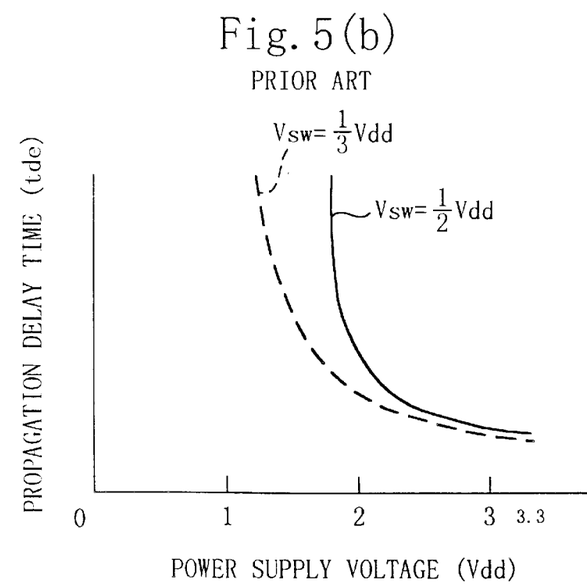

FIG. 5(b) is a graph illustrating a relationship between the power supply voltage Vdd and the propagation delay time tde of the input signal IN in the conventional input circuit 100. In FIG. 5(b), the axis of abscissas indicates the power supply voltage Vdd and the axis of ordinates indicates the propagation delay time tde. As shown in FIG. 5(b), if the switching voltage Vsw of the inverter 107 is Vdd/2, as the power supply voltage Vdd is lowered, the delay time tde drastically increases. In particular, when the power supply voltage Vdd reaches around 2 V, the delay time tde starts to increase even more abruptly, since the input voltage Vii of the inverter 107 is closer to the switching voltage Vsw. It should be noted that if the switching voltage Vsw of the inverter 107 is lowered to Vdd/3, then such an abrupt increase in delay time can be suppressed as represented by the broken lines in FIGS. 5(a) and 5(b).

However, in order to get the level inversion of the input signal done by the inverter 107 from high into low, or vice versa, the switching voltage Vsw of the inverter 107 cannot be lower than a certain limit. Accordingly, it is difficult for the conventional input circuit to radically solve the problems caused by the use of a power supply voltage Vdd making the input voltage Vii of the inverter 107 lower than the switching voltage Vsw thereof.

SUMMARY OF THE INVENTION

An object of this invention is providing an input circuit preventing the application of a voltage exceeding the breakdown voltage of the gate oxide film of a transistor even if the circuit receives a high-voltage signal, and suppressing the increase in propagation delay even with a reduced power supply voltage.

The input circuit of the present invention includes: an input terminal receiving an input signal; a power supply terminal through which a power supply voltage is supplied; a first n-channel MOS transistor, one terminal and the gate of which are connected to the input terminal and to the power supply terminal, respectively; and a clamping circuit provided between the gate of the first n-channel MOS transistor and the power supply terminal. The input signal, which is received at the one terminal of the first n-channel MOS transistor with an amplitude equal to or larger than that of the power supply voltage, is output through the other terminal of the first n-channel MOS transistor with an amplitude equal to that of the power supply voltage.

In this circuit, a signal with an amplitude equal to that of the power supply voltage is output through the other terminal of the n-channel MOS transistor, not the amplitude of a voltage obtained by subtracting its threshold voltage from the power supply voltage as in the conventional input circuit. That is to say, even if the power supply voltage is reduced, a signal, having a voltage high enough to ensure the operation of other transistors connected to the n-channel MOS transistor, still can be output through the other terminal. Accordingly, it is possible to suppress the increase in propagation delay of the input signal.

Also, even if a high-level signal is received at the input terminal, the potential difference across the gate oxide film in the n-channel MOS transistor does not exceed the breakdown voltage of the gate oxide film. This is because the potential difference is smaller in this configuration than that of the conventional input circuit by its threshold voltage.

Accordingly, even if the power supply voltage is reduced, the increase in propagation delay of the input signal can be suppressed without causing the application of a voltage, higher than the breakdown voltage thereof, to the gate oxide film.

In one embodiment of the present invention, the clamping circuit may turn ON when a voltage at the gate of the first n-channel MOS transistor reaches a clamping voltage, which is a sum of the power supply voltage and a threshold voltage of the first n-channel MOS transistor. And the voltage at the gate of the first n-channel MOS transistor can be controlled not to reach or exceed the clamping voltage.

In such an embodiment, even if a high-level signal has been received, it is possible to prevent the gate voltage at the first n-channel MOS transistor from increasing to exceed the sum of the power supply voltage and the threshold voltage thereof.

In another embodiment, the clamping circuit preferably includes a second n-channel MOS transistor, the gate of the second n-channel MOS transistor being connected to one terminal of the second n-channel MOS transistor receiving a lower voltage.

In such an embodiment, the above effects can be attained using a simple configuration.

In still another embodiment, the input circuit may further include a constant voltage determiner, connected in parallel to the clamping circuit, for determining a constant voltage at the gate of the first n-channel MOS transistor.

In such an embodiment, by keeping the gate potential of the n-channel MOS transistor at a constant voltage, a low-level input signal received can be output as it is through the other terminal of the n-channel MOS transistor, because the operation of the n-channel MOS transistor is ensured.

In still another embodiment, the constant voltage determined may include at least one of a resistor and a first p-channel MOS transistor, the gate of the first p-channel MOS transistor being connected to one terminal of the first p-channel MOS transistor receiving a lower voltage.

In such an embodiment, the constant voltage can be determined using a simple configuration.

In still another embodiment, the input circuit may further include: a gate controller connected to the other terminal of the first n-channel MOS transistor; and a second p-channel MOS transistor, one terminal of the second p-channel MOS transistor being connected to the power supply terminal and the other terminal of the second p-channel MOS transistor being connected to the other terminal of the first n-channel MOS transistor and the gate of the second p-channel MOS transistor. If a voltage at the other terminal of the first n-channel MOS transistor is at a high level, then the gate controller turns the second p-channel MOS transistor ON, thereby equalizing the voltage at the other terminal of the first n-channel MOS transistor with the power supply voltage. On the other hand, if a voltage at the other terminal of the first n-channel MOS transistor is at a low level, then the gate controller turns the second p-channel MOS transistor OFF.

In still another embodiment, the gate controller may be an inverter.

In still another embodiment, the power supply terminal may include: a first power supply terminal for applying a first power supply voltage; and a second power supply terminal for applying a second power supply voltage higher than the first power supply voltage. The first power supply terminal may be connected to the gate of the first n-channel MOS transistor, and the second power supply terminal may be connected to the second p-channel MOS transistor and to the gate controller.

In such an embodiment, if a high-level input signal has been received, then the second p-channel MOS transistor turns ON, and the voltage at the other terminal of the first n-channel MOS transistor is equalized with the second power supply voltage. Accordingly, even if the first power supply voltage is reduced to a relatively low voltage, that relatively high second power supply voltage can increase the operating speed of the input circuit.

In still another embodiment, a substrate region of the first n-channel MOS transistor is preferably connected to the input terminal.

In such an embodiment, the back bias effect of the first n-channel MOS transistor can be eliminated. Accordingly, the above effects can be attained without increasing the amplitude of the gate voltage at the first n-channel MOS transistor, thus reducing current consumed.

In still another embodiment, a substrate region of the first n-channel MOS transistor is preferably connected to the input terminal, and a substrate region of the second n-channel MOS transistor is preferably connected to the terminal of the second n-channel MOS transistor receiving the lower voltage.

In such an embodiment, the back bias effect of the first and second n-channel MOS transistors can be eliminated. Accordingly, the current consumption can be reduced without increasing the amplitude of the gate voltage at the first or second n-channel MOS transistor.

BRIEF DESCRIPTION OF THE DRAWINGS

FIG. 5($a$) is graph illustrating respective variations in gate voltage of an NMOSFET and switching voltage and input voltage of an inverter with a power supply voltage in the conventional input circuit; and FIG. 5($b$) is a graph illustrating a relationship between the power supply voltage and the propagation delay time of an input signal in the conventional input circuit.

FIG. 6($a$) is graph illustrating respective variations in gate voltage of an NMOSFET and switching voltage and input voltage of an inverter with a power supply voltage in the input circuit of the present invention; and FIG. 6($b$) is a graph illustrating a relationship between the power supply voltage and the propagation delay time of an input signal in the input circuit of the present invention.

DESCRIPTION OF THE PREFERRED EMBODIMENTS

Embodiment 1

Figure 1:
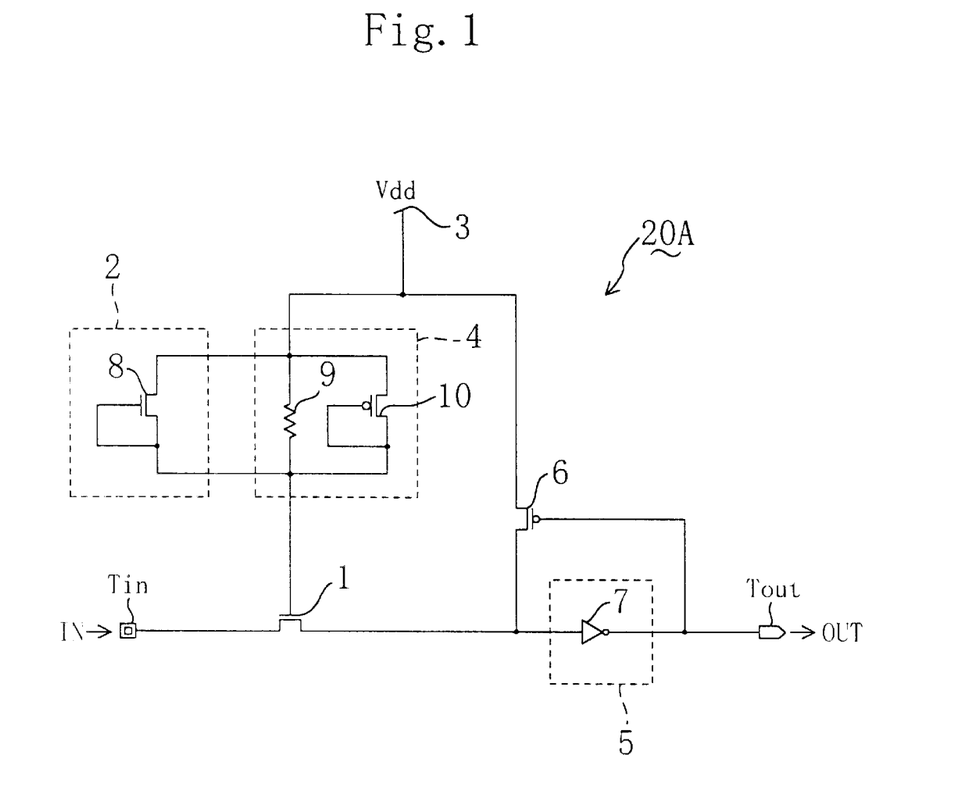
FIG. 1 is an electric circuit diagram illustrating a configuration of an input circuit according to the first embodiment of the present invention.

FIG. 1 is an electric circuit diagram illustrating a configuration for an input circuit 20A according to the first embodiment of the present invention.

As shown in FIG. 1, an input signal IN is received at an input terminal Tin of the input circuit 20A from the outside of an LSI. And an output signal OUT is transmitted to other internal circuits within the LSI through an output terminal Tout of the input circuit 20A. A power supply voltage Vdd is supplied through a power supply terminal 3 into the input circuit 20A. The fundamental configuration of the input circuit 20A is the same as that of the conventional input circuit 100 in that both of these circuits include an NMOSFET 1 or 101, an inverter 5 or 105 and a PMOSFET 6 or 106.

The input circuit 20A of this embodiment is characterized by further including a constant voltage determiner 4 and a clamping circuit 2 between the power supply terminal 3 and the gate of the NMOSFET 1. Specifically, an NMOSFET 8, a resistor 9 and a PMOSFET 10 are connected in parallel to each other between the power supply terminal 3 and the gate of the NMOSFET 1. The constant voltage determiner 4 is made up of the resistor 9 and the PMOSFET 10, while the clamping circuit 2 is constituted by the NMOSFET 8. An inverter 7 is used as a circuit 5 for controlling the gate voltage at the PMOSFET 6. In the following description, the power supply voltage Vdd supplied through the power supply terminal 3 is supposed to be 3.3 V and the gate oxide film of each MOS transistor included in the input circuit 20A is supposed to have a breakdown voltage of 3.6 V. In general, the breakdown voltage of a gate oxide film is usually defined to have some margin with respect to a power supply voltage. Accordingly, as is also the case with this circuit 20A, the breakdown voltage of a gate oxide film for a MOSFET included in an LSI operating with a power supply voltage of 3.3 V is often about 3.6 V.

Next, the operation of the input circuit 20A having such a configuration will be described with reference to FIG. 1.

If a signal with a voltage of 5 V is received at the input terminal Tin, then the voltage at one terminal of the NMOSFET 1, closer to the inverter 7, increases. In this case, a channel is formed between the source and drain of the NMOSFET 1 and a gate capacitance Cg1 is formed between the channel and the gate. Accordingly, in the NMOSFET 1, as the channel voltage thereof increases, the gate voltage Vg1 thereof also increases correspondingly. If the resistance R of the resistor 9 is sufficiently high, then the gate voltage vg1 of the NMOSFET 1 increases at approximately the same rate as the channel voltage thereof. Thereafter, when the gate voltage Vg1 of the NMOSFET 1 reaches a voltage (Vdd+Vt's) obtained by adding the threshold voltage Vt' of the NMOSFET 8, defined in view of the back bias thereof, to the power supply voltage Vdd, the NMOSFET 8 turns ON. And the increase of the gate voltage Vg1 of the NMOSFET 1 stops at the voltage (Vdd+Vt'). That is to say, the gate voltage Vg1 of the NMOSFET 1 is:

$$Vg1 = Vdd + Vt'$$

Suppose the power supply voltage Vdd is 3.3 V and the threshold voltage Vt' of the NMOSFET 8 in view of the back bias thereof is 1 V. Then, the increase in gate voltage of the NMOSFET 1 stops at 4.3 V. However, if these NMOSFETs 1 and 8 are formed on a common substrate during the same manufacturing process, then the threshold voltages Vtn and Vt' thereof can be regarded as being equal to each other. The input voltage Vii of the inverter 7 is a voltage (Vg1−Vtn) obtained by subtracting the threshold voltage Vtn of the NMOSFET 1 from the gate voltage Vg1 thereof. The input voltage Vii is given by $$Vii = Vg1 - Vtn = Vdd + Vt' - Vtn \approx Vdd$$

That is to say, the input voltage Vii of the inverter 7 increases up to the power supply voltage Vdd. Accordingly, the inverter 7 inverts the signal level to output an L-level signal. In response to this signal, the PMOSFET 6 turns ON and the input voltage Vii of the inverter 7 is fixed at the power supply voltage Vdd. Thereafter, the gate voltage Vg1 of the NMOSFET 1 decreases due to discharge through the resistor 9 down to the power supply voltage Vdd. During this process, even when the gate voltage Vg1 of the NMOSFET 1 reaches 4.3 V, the voltage applied to the gate oxide film is 1 V, which is lower than the breakdown voltage thereof. This is because the potentials in the gate and the substrate are 4.3 and 3.3 V, respectively. As a result, an L-level signal is output through the output terminal Tout.

On the other hand, if a signal with a voltage of 0 V is received at the input terminal Tin, the gate voltage Vg1 of the NMOSFET 1, as well as the channel voltage thereof, decreases. However, once the gate voltage Vg1 reaches a voltage (Vdd−Vtp) obtained by subtracting the threshold voltage Vtp of the PMOSFET 10 from the power supply voltage Vdd, the PMOSFET 10 turns ON. Accordingly, the gate voltage Vg1 does not decrease to a voltage lower than (Vdd−Vtp), which is the constant voltage of the NMOSFET 1. Even in such a case, a voltage, exceeding the breakdown voltage thereof, is never applied to the gate oxide film of the NMOSFET 1. In general, an LSI is formed on a p-type semiconductor substrate. Therefore, a substrate region (well region) of the PMOSFET 10 is n-type and it can be connected to the source, i.e., a terminal receiving the higher voltage. Accordingly, there is no need to take a back bias effect into consideration.

Suppose the threshold voltage of the PMOSFET 10 is 0.5 V. Then, the gate voltage Vg1 of the NMOSFET 1 is no lower than 2.8 V. So long as the voltage Vg1 is 2.8 V or more, the NMOSFET 1 is ON. Accordingly, the signal with a voltage of 0 V, received at the input terminal Tin, is input to the inverter 7. Responsive to the signal, the inverter 7 inverts the signal level to output an H-level signal and thereby turn the PMOSFET 6 OFF. As a result, the H-level signal is output through the output terminal Tout.

Figure 6A:
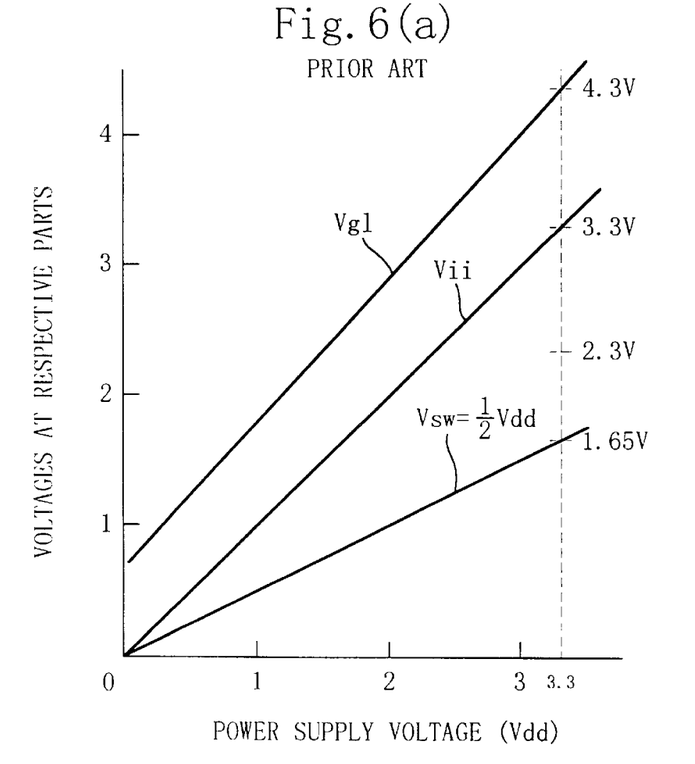

FIG. 6(*a*) is graph illustrating respective variations in gate voltage Vg1 of the NMOSFET 1 and switching voltage Vsw and input voltage Vii of the inverter 7 with the power supply voltage Vdd in the input circuit 20A of the first embodiment. In FIG. 6(*a*), the axis of abscissas indicates the power supply voltage Vdd and the axis of ordinates indicates voltages at respective parts. The switching voltage Vsw of the inverter 7 is in proportion to the power supply voltage Vdd. For example, when the power supply voltage Vdd is 3.3 V, the switching voltage Vsw is 1.65 V. The input voltage Vii of the inverter 7 is equal to the power supply voltage Vdd. Accordingly, when the power supply voltage Vdd is 3.3 V, the voltage Vii is also 3.3 V. That is to say, in the input circuit 20A of this embodiment, the input voltage Vii of the inverter 7 is always higher than the switching voltage Vsw. Thus, the inverter 7 never fails to perform the inversion operation irrespective of the power supply voltage Vdd.

Figure 6B:
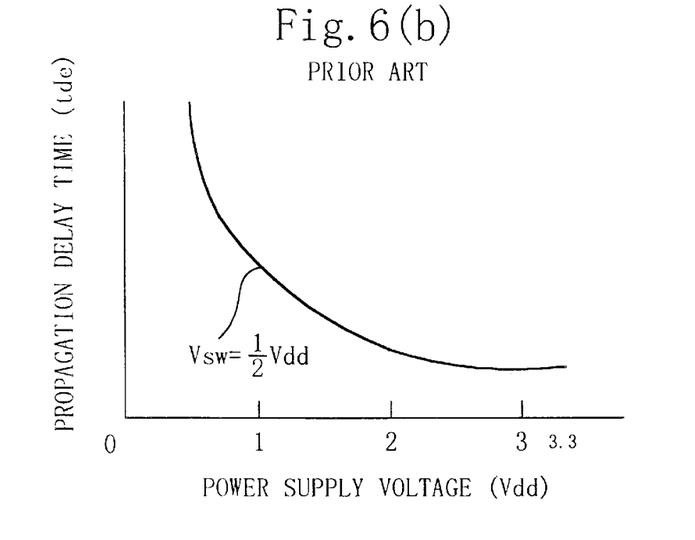

FIG. 6(*b*) is a graph illustrating a relationship between the power supply voltage Vdd and the propagation delay time tde of the input signal IN in the input circuit 20A of the present invention. In FIG. 6(*b*), the axis of abscissas indicates the power supply voltage Vdd and the axis of ordinates indicates the propagation delay time tde. As shown in FIG. 6(*b*), in the input circuit 20A, the propagation delay time tde of the input signal IN does not increase so abruptly even if the switching voltage Vsw is not lowered.

In the conventional input circuit 100 shown in FIG. 4, if the power supply voltage Vdd has been reduced when an H-level input signal IN is supplied, the voltage (Vdd−Vtn) at the other terminal of the NMOSFET 101 is as low as about 2 V and the inverter 107 cannot be operated instantaneously. The input terminal of the inverter 107 is gradually charged over a long time and then the input voltage Vii of the inverter 107 exceeds the switching voltage Vsw thereof to operate the inverter 107. However, the propagation of the input signal IN is delayed for the time required for this charging. In contrast, according to the present invention, even if the power supply voltage Vdd has been reduced when an H-level signal IN is supplied, a voltage Vii required for operating the inverter 7 is always ensured. This is because the voltage at the other terminal of the NMOSFET 1 is equalized with the power supply voltage Vdd. As a result, the propagation delay can be suppressed.

Embodiment 2

Figure 2:
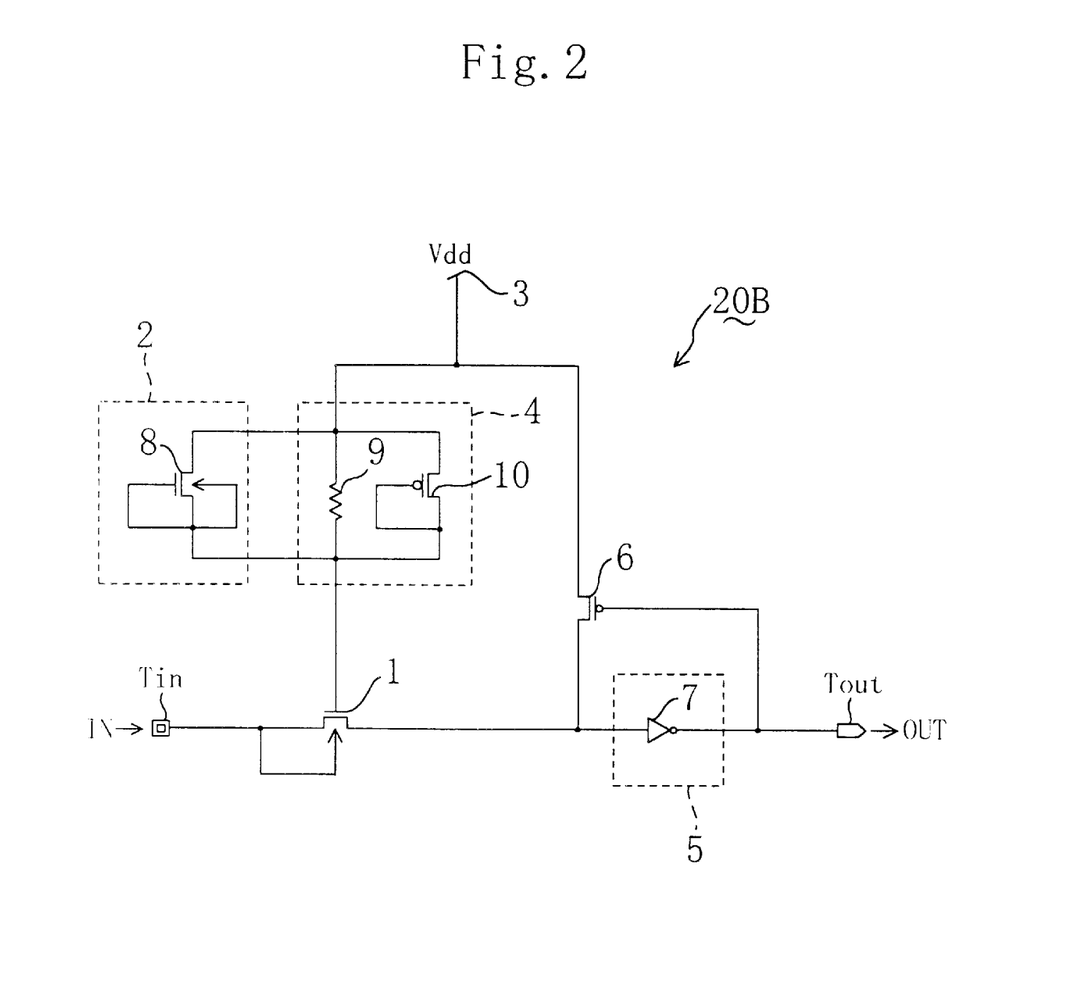
FIG. 2 is an electric circuit diagram illustrating a configuration of an input circuit according to the second embodiment of the present invention.

FIG. 2 is an electric circuit diagram illustrating a configuration for an input circuit 20B according to the second embodiment of the present invention.

The input circuit 20B is different from the input circuit 20A in that a substrate region of the NMOSFET 1 is connected to one terminal thereof closer to the input terminal IN and that of the NMOSFET 8 is connected to one terminal thereof receiving the lower voltage.

In such a configuration, the back bias effect can be eliminated from the NMOSFETs 1 and 8. Accordingly, the input circuit 20B of the second embodiment can attain the same effects as those realized by the input circuit 20A of the first embodiment even if the amplitude of the gate voltage at the NMOSFET 1 is reduced. In addition, since the amplitude of the gate voltage at the NMOSFET 1 is smaller, consumed current can be reduced, and the time required for the resistor 9 for discharging can be shortened.

Embodiment 3

Figure 3:
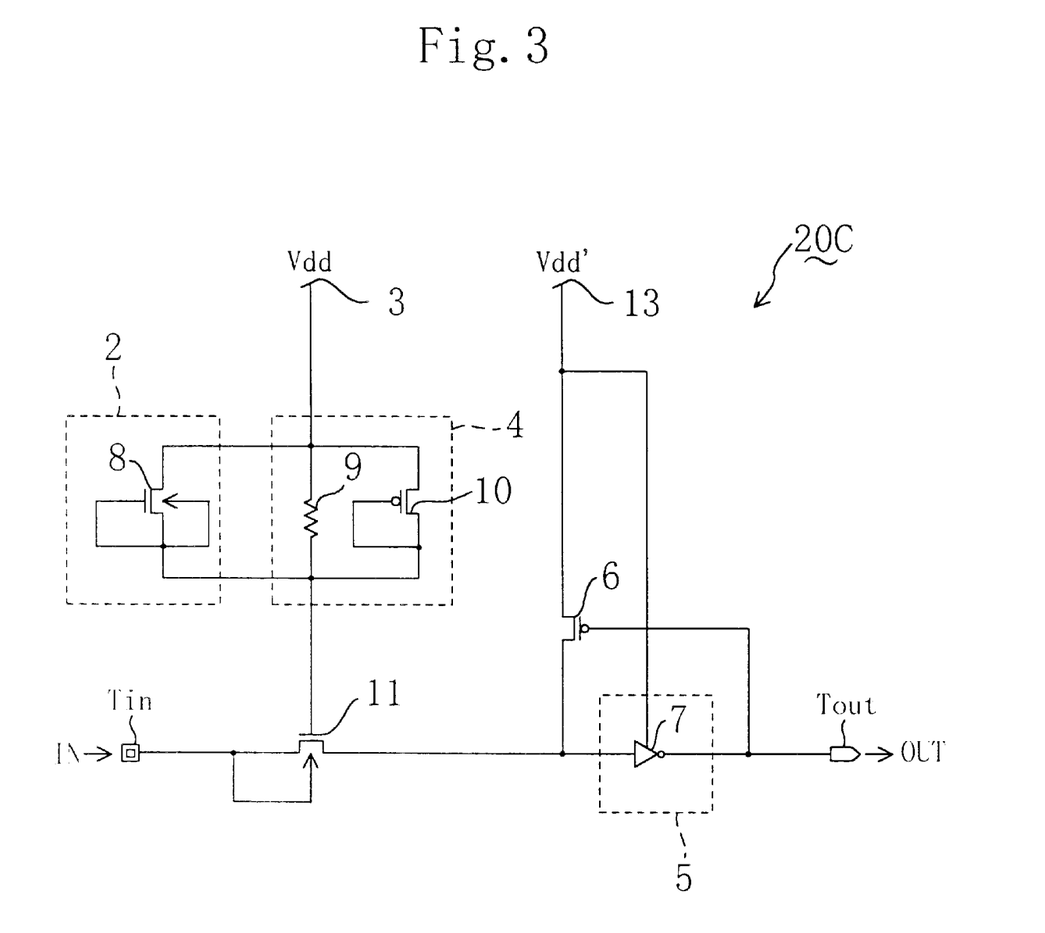
FIG. 3 is an electric circuit diagram illustrating a configuration of an input circuit according to the third embodiment of the present invention.

FIG. 3 is an electric circuit diagram illustrating a configuration for an input circuit 20C according to the third embodiment of the present invention.

The input circuit 20C shown in FIG. 3 is different from the input circuit 20B shown in FIG. 2 in that the power is supplied into the input circuit 20C through two power supply terminals 3 and 13. The power supply voltage Vdd is supplied through the terminal 3 to the gate of the NMOSFET 1, while a power supply voltage Vdd' is supplied through the terminal 13 to the PMOSFET 6 and the inverter 7. The power supply voltage Vdd' supplied through the terminal 13 is higher than the power supply voltage Vdd supplied through the terminal 3.

In this configuration, if a signal, received at the input terminal Tin, has an amplitude equal to that of the power supply voltage Vdd supplied through the terminal 3, then the signal can be converted to have an amplitude equal to that of the power supply voltage Vdd'. In such a case, the amplitude of a signal output through the output terminal Tout is equal to that of the power supply voltage Vdd' supplied through the power supply terminal 13.

In the foregoing embodiments, since no voltage drop is caused by the NMOSFET 1, the amplitude of the input voltage of the inverter 7 can be equalized with that of the power supply voltage Vdd supplied through the power supply terminal 3. Accordingly, even if the power supply voltage Vdd is reduced, the input circuit can be operated at a high speed.

It should be noted that voltages could be converted in the foregoing embodiments without the clamping circuit 2 and the constant voltage determiner 4. However, by additionally providing the clamping circuit 2 and the constant voltage determiner 4, the amplitude of the input voltage of the inverter 7 can be increased. Accordingly, even if the power supply voltage Vdd at the power supply terminal 3 is lowered, the increase in propagation delay time tde of the input signal IN can be suppressed more effectively.

In the configuration of the second embodiment, in particular, since the amplitude of the gate voltage at the NMOSFET 1 can be reduced, the power consumption can be reduced advantageously.

Also, in the configuration of the third embodiment, even if the power supply voltage Vdd is lowered, the amplitude of the voltage applied can be converted without increasing the propagation delay time tde of the input signal IN.

In the foregoing embodiments, the constant voltage determiner 4 includes the resistor 9. Alternatively, the resistor 9 may be replaced with an MOS transistor functioning as a resistor element.

What is claimed is:

1. An input circuit comprising:

an input terminal receiving an input signal;

a power supply terminal through which a power supply voltage is supplied;

a first n-channel MOS transistor, one terminal of the first n-channel MOS transistor being connected to the input terminal and the gate of the first n-channel MOS transistor being connected to the power supply terminal;

a clamping circuit provided between the gate of the first n-channel MOS transistor and the power supply terminal, wherein the input signal, which is received at the one terminal of the first n-channel MOS transistor with an amplitude equal to or larger than that of the power supply voltage, is output through the other terminal of the first n-channel MOS transistor with an amplitude equal to that of the power supply voltage; and a constant voltage determiner, connected in parallel to the clamping circuit, for determining a constant voltage at the gate of the first n-channel MOS transisitor.

2. The input circuit of claim 1, wherein the constant voltage determiner includes at least one of a resistor and a first p-channel MOS transistor, the gate of the first p-channel MOS transistor being connected to one terminal of the first p-channel MOS transistor receiving a lower voltage.

3. An input circuit comprising:

an input terminal receiving an input signal;

a power supply terminal through which a power supply voltage is supplied;

a first n-channel MOS transistor, one terminal of the first n-channel MOS transistor being connected to the input terminal and the gate of the first n-channel MOS transistor being connected to the power supply terminal;

a clamping circuit provided between the gate of the first n-channel MOS transistor and the power supply terminal, wherein the input signal, which is received at the one terminal of the first n-channel MOS transistor with an amplitude equal to or larger than that of the power supply voltage, is output through the other terminal of the first n-channel MOS transistor with an amplitude equal to that of the power supply voltage;

a gate controller connected to the other terminal of the first n-channel MOS transistor;

a p-channel MOS transistor, one terminal of the p-channel MOS transistor being connected to the power supply terminal, the other terminal of the p-channel MOS transistor being connected to the other terminal of the first n-channel MOS transistor and the gate of the p-channel MOS transistor being connected to the gate controller;

wherein if a voltage at the other terminal of the first n-channel MOS transistor is at a high level, then the gate controller turns the second p-channel MOS transistor ON, thereby equalizing the voltage at the other terminal of the first n-channel MOS transistor with the power supply voltage, and wherein if a voltage at the other terminal of the first n-channel MOS transistor is at a low level, then the gate controller turns the second p-channel MOS transistor OFF; and wherein the power supply terminal includes: a first power supply terminal for applying a first power supply voltage; and a second power supply terminal for applying a second power supply voltage higher than the first power supply voltage, and wherein the first power supply terminal is connected to the gate of the first n-channel MOS transistor, and the second power supply terminal is connected to the second p-channel MOS transistor and to the gate controller.

4. An input circuit comprising:

an input terminal receiving an input signal;

a power supply terminal through which a power supply voltage is supplied;

a first n-channel MOS transistor, one terminal of the first n-channel MOS transistor being connected to the input terminal and the gate of the first n-channel MOS transistor being connected to the power supply terminal;

a clamping circuit provided between the gate of the first n-channel MOS transistor and the power supply terminal, wherein the input signal, which is received at the one terminal of the first n-channel MOS transistor with an amplitude equal to or larger than that of the power supply voltage, is output through the other terminal of the first n-channel MOS transistor with an amplitude equal to that of the power supply voltage; and a substrate region of the first n-channel MOS transistor is connected to the input terminal.

5. An input circuit comprising:

an input terminal receiving an input signal;

a power supply terminal through which a power supply voltage is supplied;

a first n-channel MOS transistor, one terminal of the first n-channel MOS transistor being connected to the input terminal and the gate of the first n-channel MOS transistor being connected to the power supply terminal;

a clamping circuit provided between the gate of the first n-channel MOS transistor and the power supply terminal, wherein the input signal, which is received at the one terminal of the first n-channel MOS transistor with an amplitude equal to or larger than that of the power supply voltage, is output through the other terminal of the first n-channel MOS transistor with an amplitude equal to that of the power supply voltage;

wherein the clamping circuit includes a second n-channel MOS transistor, the gate of the second n-channel MOS transistor being connected to one terminal of the second n-channel MOS transistor;

a substrate region of the first n-channel MOS transistor is connected to the input terminal, and wherein a substrate region of the second n-channel MOS transistor is connected to the terminal of the second n-channel MOS transistor receiving the lower voltage.

* * * * *